(12) United States Patent
Su et al.

(10) Patent No.: US 6,677,228 B1
(45) Date of Patent: Jan. 13, 2004

(54) REINFORCED ALUMINUM COPPER BONDING PAD

(75) Inventors: Yea-Zan Su, Hsin-Chu (TW); Cheng-Chung Huang, Jubei (TW); Huai-Jen Hsu, Hsinchu (TW); Wen-Tsan Chang, Hsin Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/289,978

(22) Filed: Nov. 7, 2002

(51) Int. Cl.$^7$ ................................ H01L 21/44
(52) U.S. Cl. ...................... 438/612; 257/784
(58) Field of Search .................. 438/612, 597, 438/618, 687; 257/784

(56) References Cited

U.S. PATENT DOCUMENTS

| | | | |
|---|---|---|---|
| 6,060,378 A | 5/2000 | Rolfson | 438/612 |
| 6,200,889 B1 | 3/2001 | Rolfson | 438/612 |
| 6,261,704 B1 | 7/2001 | Paranthaman et al. | 428/637 |
| 6,287,950 B1 | 9/2001 | Wu et al. | 438/612 |

*Primary Examiner*—Richard Elms
*Assistant Examiner*—Beth E. Owens
(74) *Attorney, Agent, or Firm*—George O. Saile; Stephen B. Ackerman

(57) ABSTRACT

A method of forming a bond pad structure reinforced with insulator spacers located on the sides of the bond pad structure has been developed. The method features formation of an aluminum based bond pad structure located overlying and contacting a top portion of a metal interconnect structure exposed in an opening in an intermetal dielectric layer. After deposition of an insulator layer such as silicon nitride or silicon oxide, an anisotropic dry etch procedure is employed to define the insulator spacers on the sides of the bond pad structure. The presence of insulator spacers on the sides of the bond pad structure reduces the risk of bond pad damage which can occur during subsequent pre-wire bonding dicing and transportation procedures.

30 Claims, 3 Drawing Sheets

REINFORCED ALUMINUM COPPER BONDING PAD

BACKGROUND OF THE INVENTION (1) Field of the Invention

The present invention relates to methods used to fabricate semiconductor devices, and more specifically to a method of forming a bond pad structure employed to accommodate a subsequent wire bond.

(2) Description of Prior Art

Connection of a specific semiconductor chip to an external component such as a module or package, can be accomplished via a wire bonding technology which features bonding of a metal wire, such as gold wire, to a specific region of the semiconductor chip with the other end of the wire then connecting to the external component. A critical aspect of the wire bond procedure is the integrity of the semiconductor region, a conductive bond pad structure, to which the wire will be connected to. Bonding pads comprised of conductive materials such as aluminum, have to survive several processes prior to the wire bond procedure. For example the semiconductor wafer comprised with numerous semiconductor chips has to be thinned to approximately to a thickness of 15 mils via a backside grounding procedure, prior to dicing or separation of the individual semiconductor chips. This procedure can damage a bond pad structure, specifically if a raised topography of the bond pad structure is exposed during the wafer thinning procedure. In addition an unprotected bond pad structure can be damaged in terms of scratches and defects during transporting of the pre-diced semiconductor substrate to an another area of a semiconductor facility in which dicing and wire bonding functions will be performed. Damaged bond pads can adversely influence the quality of wire bond in terms of increased interface resistance, which in turn deleteriously influence the reliability and yield of a package comprised with individually wire bonded semiconductor chips.

This invention will describe a novel procedure for reinforcement of the bond pad structure enabling the bond pad structure, even with a topology higher than the underlying elements, to withstand all procedures performed prior to dicing, such as wafer thinning and transportation. Prior art such as Wu et al, in U.S. Pat. No. 6,287,950, Paranthaman et al, in U.S. Pat. 6,261,704 B1, Rolfson, in U.S. Pat. No. 6,200,889 B1, and Rolfson, in U.S. Pat. No. 6,060,378, describe bonding pad structures and methods of forming these bon pad structures, however none of the prior art describe the present invention in which a reinforced bond pad structure and the method of forming the reinforced bond pad structure, is described.

SUMMARY OF THE INVENTION

It is an object of this invention to form a bond pad structure on a conductive region of a semiconductor substrate, to accommodate a wire bond in turn used to connect a semiconductor chip to an external package.

It is another object of this invention to strengthen the bond pad structure via formation of insulator spacers on the sides of the bond pad structure.

In accordance with the present invention, a reinforced bond pad structure and the method of forming the reinforced bond pad structure on a semiconductor substrate is described. After formation of an opening in an intermetal dielectric (IMD) layer exposing a portion of a top surface of an upper level metallization structure, a conductive metal layer is deposited. Definition of a conductive bond pad structure is accomplished via conventional photolithographic and dry etching procedures, with a first portion of the conductive bond structure located contacting the portion of upper level metallization structure exposed in the opening in the IMD layer, and with second portions of the conductive bond pad structure overlying portions of the IMD layer. An insulator layer is next deposited and subjected to an anisotropic dry etch procedure forming insulator spacers on the sides of the conductive bond pad structure. Damage to the bond pad structure as a result of subsequent procedures is now reduced as a result of a bond pad structure featuring reinforcing insulator sidewall spacers.

BRIEF DESCRIPTION OF THE DRAWINGS

The object and other advantages of this invention are best described in the preferred embodiment, with reference to the attached drawings that include.

DESCRIPTION OF PREFERRED EMBODIMENTS

Figure 1:
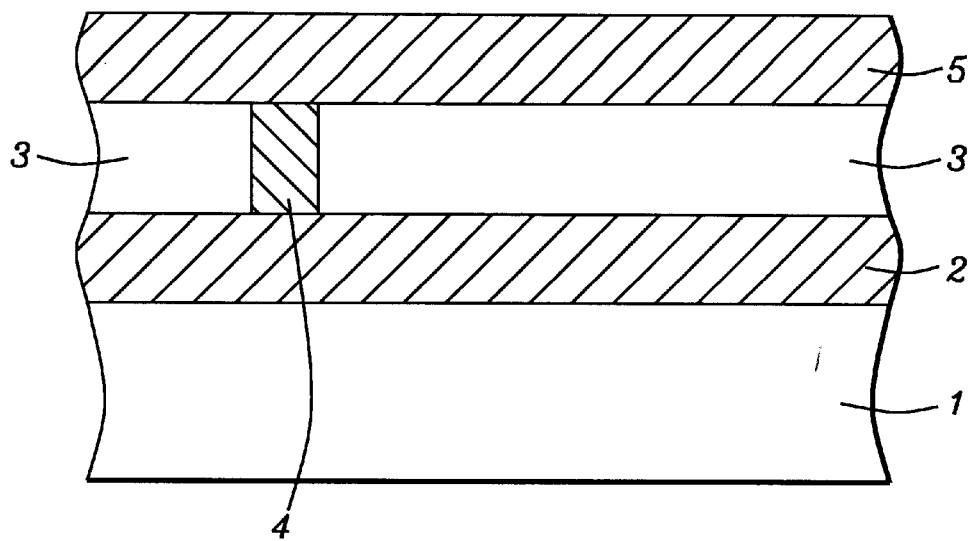
FIGS. 1–5, which schematically, in cross-sectional style, describe a conductive bond pad structure reinforced via insulator sidewall spacers, as well as describing the key process stages employed to form the insulator spacer reinforced, conductive bond pad structure.

An insulator spacer, reinforced bond pad structure, and a method of forming the bond pad structure featuring insulator sidewall spacers, will now be described in detail. FIG. 1 schematically shows a semiconductor substrate prior to formation of a bond pad structure, featuring interconnect metallization levels, intermetal dielectric (IMD) layers and conductive via structures. Interconnect metal structure 2, located on IMD layer 1, can communicate with lower level interconnect metal structures which in turn contact and communicate with active device regions in a semiconductor substrate, or interconnect metal structure 2 can directly contact the same active device regions of the semiconductor substrate. In this example interconnect metal structure 2, comprised of a conductive layer such as copper, is formed on IMD layer 1, wherein IMD layer 1, in turn is comprised of a dielectric layer such as silicon oxide, phosphosilicate glass (PSG), or boro-phosphosilicate glass (BPSG) with interconnect metal structure 2 communicating with the active device regions in the semiconductor substrate via contact metal plug structures (not shown in the drawings) formed in IMD layer 1. Interconnect metal structure 2 is obtained via deposition of the metal layer via plasma vapor deposition (PVD) procedures then defined via photolithographic and dry etching procedures.

After deposition of IMD layer 3, again comprised of either silicon oxide, PSG, or BPSG, a via hole is opened in IMD layer 3, exposing a portion of the top surface of interconnect metal structure 2. Metal plug structure 4 is next formed in the via hole, contacting the exposed portion of interconnect metal structure 2. Metal plug structure 4 can be comprised of copper obtained via PVD deposition of the metal followed by a chemical mechanical polishing (CMP) procedure, removing metal from the top surface of IMD layer 3. Interconnect metal structure 5, to be used as the upper level metal interconnect structure, is next formed on IMD layer 3 and on the exposed top surface of metal plug structure 4. Interconnect metal structure 5 again is comprised of a metal such as copper, obtained via PVD procedures, with definition of interconnect metal structure 5, accomplished via photolithographic and dry etching procedures. The result of these procedures is schematically shown in FIG. 1.

Figure 2:
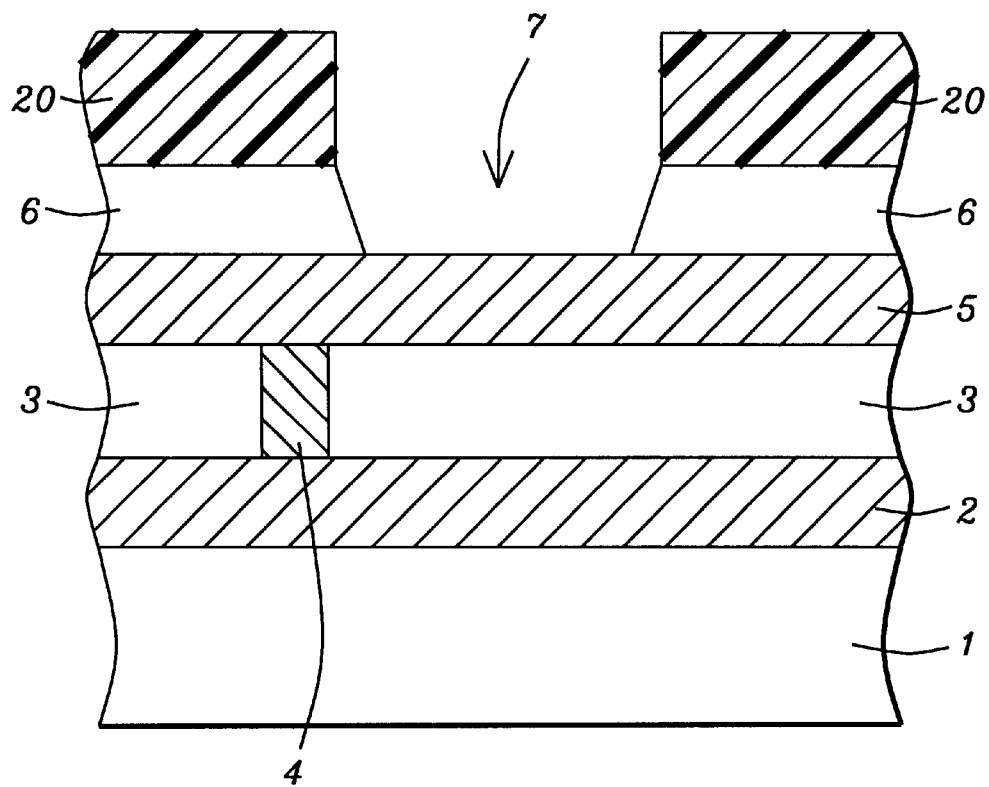

After formation of interconnect metal structure 5, MD layer 6, comprised of either silicon oxide, BPSG, or PSG, is deposited via plasma enhanced chemical vapor deposition PECVD) procedures to a thickness between about 11,000 to 13,000 Angstroms. Photoresist shape 20 is next formed and used as an etch mask allowing bond pad opening 7 to be selectively defined in IMD layer 6. Definition of bond pad opening 7, exposing a portion of the top surface of interconnect metal structure 5, is accomplished selectively via a dry etch procedure using $CHF_3$ as the selective etchant for IMD layer 6. If desired a selective wet etch procedure can be employed for definition of bad pad opening 7, using a buffered or dilute hydrofluoric acid solution as the selective etchant for IMD layer 6, with the etch procedure selectively terminating at the appearance of interconnect metal structure 5. The result of these procedures is schematically illustrated in FIG. 2. Photoresist shape 20 is then removed via plasma oxygen ashing procedures.

Figure 3:
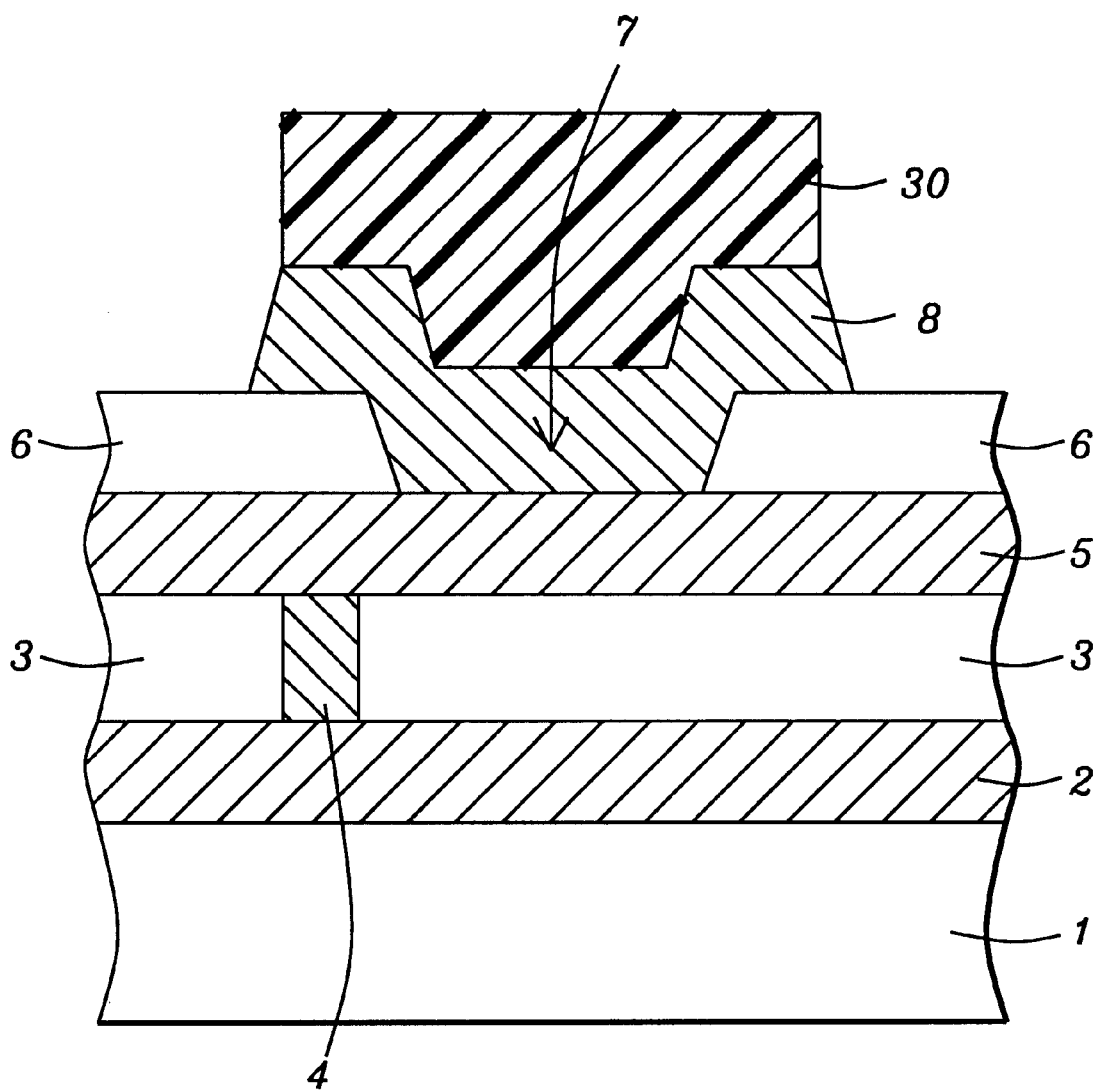

Formation of bond pad structure 8, is next addressed and schematically described in FIG. 3. After a pre-clean procedure, used to remove native oxide from the exposed top surface of interconnect metal structure 5, a metal layer such as aluminum or aluminum-copper (AlCu) is deposited via PVD procedures, to a thickness between about 11,000 to 13,000 Angstroms, completely filling bond pad opening 7. The weight percent of copper, in the aluminum-copper layer is between about 0 to 2. Photoresist shape 30 is then formed and used as an etch mask, allowing a dry etch procedure such as a reactive ion etch (RIE) (procedure to selectively remove exposed portions of metal resulting in the formation of bond pad structure 8. The dry etch procedure is performed using $Cl_2$ as an etchant for AlCu, selectively terminating at the appearance of the top surface of IMD layer 6. Photoresist shape 30 is removed again via use of plasma oxygen ashing procedures.

Figure 4:
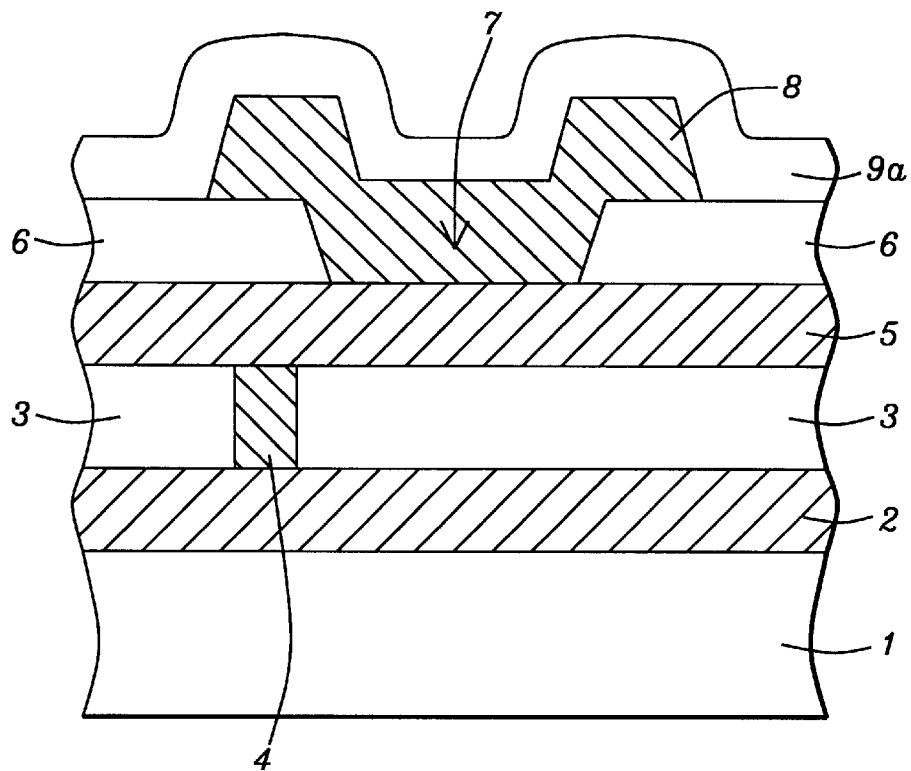

Bond pad structure 8 is now comprised with a first portion overlying and contacting interconnect metal structure 5, in bond pad opening 7, while second portions of bond pad structure 8 overlays the top surface of IMD layer 6. Prior to forming wire bond to bond pad structure 8, the semiconductor wafer is thinned via backside grounding procedure, followed by transporting of the thinned semiconductor substrate to a location in which individual semiconductor chips will be obtained via a dicing procedure. The raised, or second, portions of bond pad structure 8 are vulnerable during the thinning and transportation procedures, wherein the AlCu or aluminum bond pad material can become defective as a result of scratches, gouges, or breakage during these pre-dicing procedures. The defects in the bond pad structure can deleteriously influence the quality of a subsequent wire bond applied to the defective bond pad structure. Therefore a method of reinforcing the bond pad structure prior to the thinning and transporting procedures is next employed and schematically shown in FIGS. 4–5.

Figure 5:
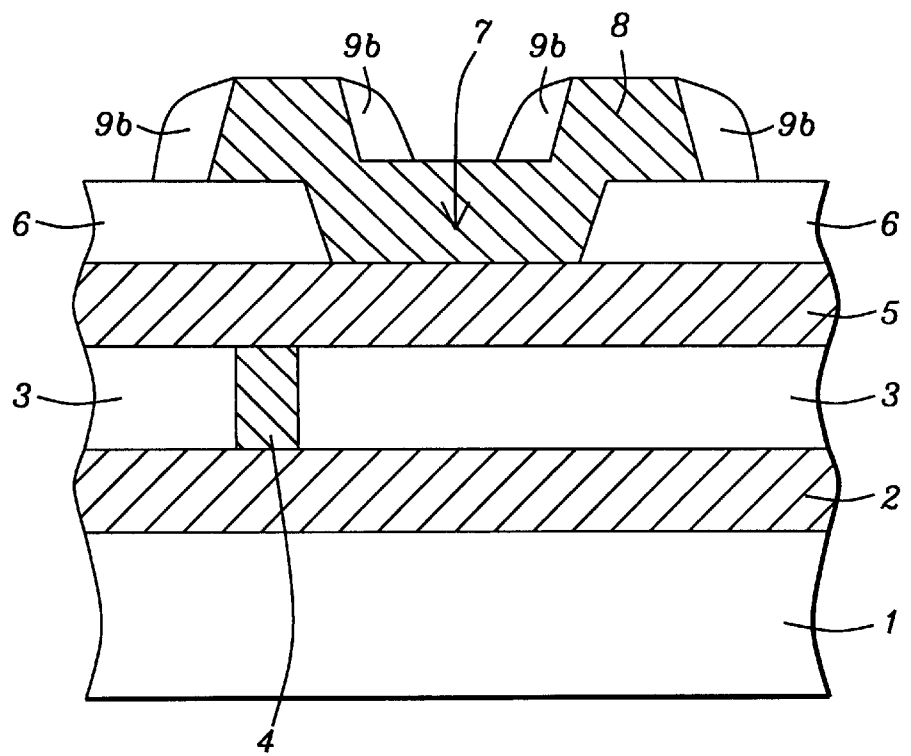

Insulator layer 9a, such as silicon nitride, or silicon oxide, is deposited at a thickness between about 6,000 to 14,000 Angstroms via PECVD procedures. Insulator layer 9a, schematically shown in FIG. 4, completely covers and contours bond pad structure 8. An anisotropic RIE procedure using $CF_4$ or $CHF_3$ as a selective etchant for insulator layer 9a is then employed to define insulator spacers 9b on the exposed sides of bond pad structure 8. This is schematically shown in FIG. 5. Bond pad structure 8, now reinforced via insulator spacers 9b, can withstand the pre-wire bond procedures, such as substrate thinning and transporting procedures, with less risk of damage to the bond pad structure than counterpart bond pad structures finalized without insulator sidewall spacers. The reduced damage to the bond pad structure directly results in improved quality of a subsequent wire bond, such as gold wire bond, formed on the top surface of the bond pad structure. The quality in terms of decreased interface resistance between the gold wire and the bond pad structure has been improved as a result of reducing the damage to the bond pad structure during subsequent processes, again as a result of the formation of the reinforcing insulator spacers.

While this invention has been particularly shown and described with reference to, the preferred embodiments thereof, it will be understood by those skilled in the art that various changes in form and details may be made without departing from the spirit and scope of this invention.

What is claimed is:

1. A method of forming a bond pad structure on a semiconductor substrate, comprising the steps of:

forming a metal interconnect structure on an underlying first dielectric layer, with said metal interconnect structure communicating with active device regions in said semiconductor substrate;

forming an opening in a second dielectric layer exposing a portion of a top surface of said metal interconnect structure;

forming said bond pad structure in said opening in said second dielectric layer, with portions of said bond pad structure overlying a top surface of said second dielectric layer; and forming insulator spacers on sides of said bond pad structure.

2. The method of claim 1, wherein said first dielectric layer is chosen from a group containing silicon oxide, boro-phosphosilicate glass and phosphosilicate glass.

3. The method of claim 1, wherein said metal interconnect structure is comprised of copper.

4. The method of claim 1, wherein said second dielectric layer is chosen from a group containing silicon oxide, boro-phosphosilicate glass and phosphosilicate glass.

5. The method of claim 1, wherein said second dielectric layer is deposited at a thickness between about 11,000 to 13,000 Angstroms via plasma enhanced chemical vapor deposition (PECVD) procedures.

6. The method of claim 1, wherein said bond pad structure is comprised of aluminum copper, with a weight percent of copper between about 0 to 2.

7. The method of claim 1, wherein the thickness of said bond pad structure is between about 11,000 to 14,000 Angstroms.

8. The method of claim 1, wherein said insulator spacers are comprised of silicon nitride.

9. The method of claim 1, wherein said insulator spacers are comprised of silicon oxide.

10. The method of claim 1, wherein the thickness of said insulator spacers is between about 6,000 to 14,000 Angstroms.

11. The method of claim 1, wherein said insulator spacers are formed via deposition of an insulator layer followed by an anisotropic reactive ion etch procedure using $CF_4$ or $CHF_3$ as an etchant for the insulator layer.

12. A method of forming a bond pad structure on a semiconductor substrate, wherein said bond pad structure is reinforced via formation of insulator spacers on sides of said bond pad structure, comprising the steps of:

forming a copper interconnect structure on an underlying first dielectric layer, with said copper interconnect structure communicating with active device regions in said semiconductor substrate;

depositing a second dielectric layer;

defining a bond pad opening in a second dielectric layer exposing a portion of a top surface of said copper interconnect structure;

depositing an aluminum-based layer completely filling said bond pad opening;

performing a patterning procedure to define said bond pad structure in said bond pad opening, with portions of said bond pad structure overlying a top surface of said second dielectric layer;

depositing an insulator layer; and performing an anisotropic reactive ion etch procedure to define said insulator spacers on the sides of said bond pad structure.

13. The method of claim 12, wherein said first dielectric layer is chosen from a group containing silicon oxide, boro-phosphosilicate glass and phosphosilicate glass.

14. The method of claim 12, wherein said copper interconnect structure is formed via a dry etch procedure applied to a copper layer.

15. The method of claim 12, wherein said second dielectric layer is chosen from a group containing silicon oxide, boro-phosphosilicate glass and phosphosilicate glass.

16. The method of claim 12, wherein said second dielectric layer is deposited at a thickness between about 11,000 to 13,000 Angstroms via plasma enhanced chemical vapor deposition (PECVD) procedures.

17. The method of claim 12, wherein said bond pad opening is formed in said second dielectric layer via dry etching procedures using $CHF_3$ as a selective etchant for said second dielectric layer.

18. The method of claim 12, wherein said aluminum-based layer is an aluminum-copper layer, comprised with a weight percent of copper between about 0 to 2.

19. The method of claim 12, wherein said aluminum based layer is obtained via plasma vapor deposition procedures at a thickness between about 11,000 to 14,000 Angstroms.

20. The method of claim 12, wherein said patterning procedure used to define said bond pad structure is a reactive ion etch procedure using $Cl_2$ as an etchant for said aluminum-based layer.

21. The method of claim 12, wherein said insulator layer is a silicon nitride layer, obtained via plasma enhanced chemical vapor deposition procedures at a thickness between about 6,000 to 14,000 Angstroms.

22. The method of claim 12, wherein said insulator layer is a silicon oxide layer, obtained via plasma enhanced chemical vapor deposition procedures at a thickness between about 6,000 to 14,000 Angstroms.

23. The method of claim 12, wherein said anisotropic reactive ion etch procedure used to define said insulator spacers on sides of said bond pad structure is performed using $CF_4$ or $CHF_3$ as an etchant.

24. A bond pad structure on a semiconductor substrate, featuring insulator spacers located on the sides of said bond pad structure, comprising:

a metal interconnect structure on a first dielectric layer, with said metal interconnect structure contacting active device regions in said semiconductor substrate, or with said metal interconnect structure contacting a lower level metal structure wherein said lower level metal structure in turn contacts active device regions in said semiconductor substrate;

a second dielectric layer on said metal interconnect structure;

an opening in said second dielectric layer exposing a portion of a top surface of said metal interconnect structure;

a bond pad structure with a first portion of said bond pad structure located in said opening in said second dielectric layer, and with second portions of said bond pad structure overlying portions of said second dielectric layer located adjacent to said opening in said second dielectric layer; and said insulator spacers located on sides of said bond pad structure.

25. The method of claim 24, wherein said metal interconnect structure is comprised of copper.

26. The method of claim 24, wherein said second dielectric layer is comprised of either silicon oxide, boro-phosphosilicate glass or phosphosilicate glass.

27. The bond pad structure of claim 24, wherein said bond pad is comprised of aluminum-copper, wherein the weight percent of copper in aluminum-copper is between about 0 to 2.

28. The bond pad structure of claim 24, wherein the thickness of said bond pad structure is between about 11,000 to 14,000 Angstroms.

29. The bond pad structure of claim 24, wherein said insulator spacers are comprised of silicon nitride at a thickness between about 6,000 to 14,000 Angstroms.

30. The bond pad structure of claim 24, wherein said insulator spacers are comprised of silicon oxide at a thickness between about 6,000 to 14,000 Angstroms.

* * * * *